(12) United States Patent
Fang et al.

(10) Patent No.: US 11,196,250 B2
(45) Date of Patent: Dec. 7, 2021

(54) BIDIRECTIONAL PRECISION SURGE CLAMP WITH NEAR-ZERO DYNAMIC RESISTANCE AND ULTRA-LOW LEAKAGE CURRENT

(71) Applicant: Texas Instruments Incorporated, Dallas, TX (US)

(72) Inventors: Zhao Fang, Plano, TX (US); Emmanuel Osei Boakye, Dallas, TX (US); Mark Benjamin Welty, McKinney, TX (US); Eddie W. Yu, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 350 days.

(21) Appl. No.: 16/027,914

(22) Filed: Jul. 5, 2018

(65) Prior Publication Data
US 2019/0123556 A1  Apr. 25, 2019

Related U.S. Application Data

(60) Provisional application No. 62/574,866, filed on Oct. 20, 2017.

(51) Int. Cl.
*H02H 9/04* (2006.01)
*H01L 29/08* (2006.01)
(Continued)

(52) U.S. Cl.
CPC ......... *H02H 9/046* (2013.01); *H01L 27/0255* (2013.01); *H01L 27/0266* (2013.01);
(Continued)

(58) Field of Classification Search
CPC ............ H01L 27/0255; H01L 27/0285; H01L 27/0266; H01L 29/866; H01L 29/1095;
(Continued)

(56) References Cited

U.S. PATENT DOCUMENTS

| | | | | |
|---|---|---|---|---|
| 5,875,245 A | * | 2/1999 | Miyasita | ................. H04M 3/30 379/382 |
| 2006/0092589 A1 | * | 5/2006 | Bhattacharya | ...... H01L 27/0266 361/91.1 |

(Continued)

*Primary Examiner* — Kevin J Comber
(74) *Attorney, Agent, or Firm* — Michelle F. Murray; Charles A. Brill; Frank D. Cimino

(57) ABSTRACT

A surge protection device for providing bidirectional detections of one or more surge events. The device has low dynamic resistance during a surge protection mode, and it conducts ultra-low leakage current outside of the surge protection mode. In one implementation, the device includes first and second power transistors, a sensing circuit, and a driver circuit. The first power transistor includes a first source terminal that is coupled to the substrate, and the second power transistor includes a second source terminal that is coupled to the substrate. The sensing circuit is configured to detect a voltage of the first pin relative to the second pin and generate a sense signal when the voltage exceeds a threshold. The driver circuit is configured to generate a driver signal based on the sense signal and output the driver signal to at least one of the first or second gate terminal.

19 Claims, 4 Drawing Sheets

(51) Int. Cl.
*H01L 27/02* (2006.01)
*H01L 29/417* (2006.01)
*H01L 29/866* (2006.01)
*H01L 29/10* (2006.01)
*H01L 29/78* (2006.01)

(52) U.S. Cl.
CPC ...... *H01L 27/0285* (2013.01); *H01L 29/0847* (2013.01); *H01L 29/1095* (2013.01); *H01L 29/41758* (2013.01); *H01L 29/866* (2013.01); *H01L 29/7835* (2013.01)

(58) Field of Classification Search
CPC ........... H01L 29/0847; H01L 29/41758; H01L 29/7835; H02H 9/046; H02H 9/041; H02H 9/04; H02H 9/005; G01R 19/16519; G01R 19/16523
USPC .......................................................... 361/56
See application file for complete search history.

(56) References Cited

U.S. PATENT DOCUMENTS

| | | | |
|---|---|---|---|
| 2010/0118459 A1* | 5/2010 | Logiudice | H02H 11/003 361/84 |
| 2015/0092307 A1* | 4/2015 | Petruzzi | H02H 9/041 361/56 |
| 2015/0303678 A1 | 10/2015 | Wang et al. | |
| 2018/0138696 A1* | 5/2018 | Tang | H02H 9/041 |

* cited by examiner

BIDIRECTIONAL PRECISION SURGE CLAMP WITH NEAR-ZERO DYNAMIC RESISTANCE AND ULTRA-LOW LEAKAGE CURRENT

CROSS REFERENCE TO RELATED APPLICATIONS

Under 35 U.S.C. § 119(e), this application claims the benefit of priority to U.S. Provisional Patent Application No. 62/574,866, filed on Oct. 20, 2017, the entirety of which is hereby incorporated herein by reference.

BACKGROUND

A surge clamp is a device that provides surge protection to one or more electronic components that are sensitive to voltage surge. For instance, a power supply system can be protected by a surge clamp so that downstream devices can operate at a relatively safe voltage level even when the system is under a surge event. Conventional transient voltage suppression (TVS) clamps are widely used as surge clamps across a wide range of applications. However conventional TVS clamps include only diodes or diode-like devices, in which there is no active circuit to form any feedback loop. As such, the dynamic resistance (e.g., $R_{dyn}=\Delta V/\Delta I$) of a TVS clamp can be fairly high during a surge event. The high dynamic resistance $R_{dyn}$ may reduce the precision in clamping voltage with respect to a large amount of surge current. Also, the clamping voltage of a TVS clamp may be set at a relatively high voltage level along the I-V curve after a surge event has started. And the relatively high clamping voltage may render a TVS clamp less robust and reliable for protecting downstream devices.

SUMMARY

The present disclosure describes systems and techniques relating to surge protection in electronic systems. In one aspect, the disclosed systems and techniques solve the problem of high dynamic resistance during a surge event by introducing a surge clamp architecture that can conduct a large amount of surge current at an early stage of voltage surge. The disclosed surge clamp architecture can be adapted to provide bidirectional surge protection across two voltage pins, which may serve as a pair of voltage supply rails or a pair of signal paths. Advantageously, the disclosed bidirectional surge protection scheme provides high precision sensing of a surge event and conducts ultra-low leakage current in the absence of a surge event.

In one implementation, for example, the disclosed solution introduces an integrated circuit die having first and second pins, first and second drain extended transistors, a voltage sensing circuit, and a driver circuit. The first drain extended transistor includes a first gate terminal, a first drain terminal that is coupled to the first pin, and a first source terminal that is coupled to a middle node. The second drain extended transistor includes a second gate terminal, a second drain terminal that is coupled to the second pin, and a second source terminal that is coupled to the first source terminal via the middle node. The voltage sensing circuit is coupled to the first and second pins, and the voltage sensing circuit includes a sense output node. The driver circuit includes a driver input node that is coupled to the sense output node, and a driver output node that is coupled to at least one of the first or second gate terminal.

In another implementation, for example, the disclosed solution introduces another integrated circuit die having first and second pins, a substrate, first and second power transistors, first to fourth current paths, and first and second driver circuits. The first power transistor includes a first gate terminal, a first drain terminal that is coupled to the first pin, and a first source terminal that is coupled to the substrate. The second power transistor includes a second gate terminal, a second drain terminal that is coupled to the second pin, and a second source terminal that is coupled to the substrate. The first current path includes a first diode that is coupled to the first pin, and a positive voltage clamp circuit that is coupled to the second pin. The second current path mirrors the first current path, and the second current path includes a second diode having a first forward bias orienting from the first pin to the second pin. The first driver circuit is coupled between the second current path and the first gate terminal. The third current path includes a third diode that is coupled to the second pin, and a negative voltage clamp circuit that is coupled to the first pin. The fourth current path mirrors the third current path, and the fourth current path includes a fourth diode having a second forward bias orienting from the second pin to the first pin. The second driver circuit that is coupled between the fourth current path and the second gate terminal.

In yet another implementation, for example, the disclosed solution introduces yet another integrated circuit die having first and second pins, a substrate, first and second power transistors, a sensing circuit, and a driver circuit. The first power transistor includes a first gate terminal, a first drain terminal that is coupled to the first pin, and a first source terminal that is coupled to the substrate. The second power transistor includes a second gate terminal, a second drain terminal that is coupled to the second pin, and a second source terminal that is coupled to the substrate. The sensing circuit is configured to detect a voltage of the first pin relative to the second pin and generate a sense signal when the voltage exceeds a threshold. The driver circuit is configured to generate a driver signal based on the sense signal and output the driver signal to at least one of the first or second gate terminal.

DRAWING DESCRIPTIONS

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

As discussed above, transient voltage suppression (TVS) clamps can be implemented by diodes or diode-like devices.

These types of TVS clamps generally do not include any active circuit to form a feedback loop, without which the dynamic resistance may get fairly high during a surge clamping operation. High dynamic resistance may increase the clamp voltage and transient current propagated to the downstream protected device, both of which can be problematic for voltage sensitive applications. As an example, for a TVS clamp with a reverse working voltage (VRWM) of 33V, the clamping voltage during an 8 μs to 20 μs current surge of 30 A can be as high as 50V to 60V. Because of the difference between the VRWM and the actual clamping voltage, these types of TVS clamps may not be able to provide adequate protection to downstream devices.

One approach to mitigate the issues of high dynamic resistance may involve over designing downstream devices to tolerate the high clamping voltage. However, this approach is costly and it may not be scalable to the extent that an electronic system has many pins for surge protection. A second approach to mitigate high dynamic resistance may involve over designing the TVS clamp to be a much larger size than is typically used. However, this approach is also costly and may not be scalable to the extent that an electronic system has many pins for surge protection. A third approach may involve lowering the dynamic resistance, and thus the clamping voltage, by using one or more surge clamp devices with feedback circuitry. Each of the surge clamp devices can be a unidirectional surge clamp that has a feedback path to suppress the dynamic resistance to a low threshold and keep the clamping voltage low and flat when the surge current exceeds a predetermined level.

Figure 1:
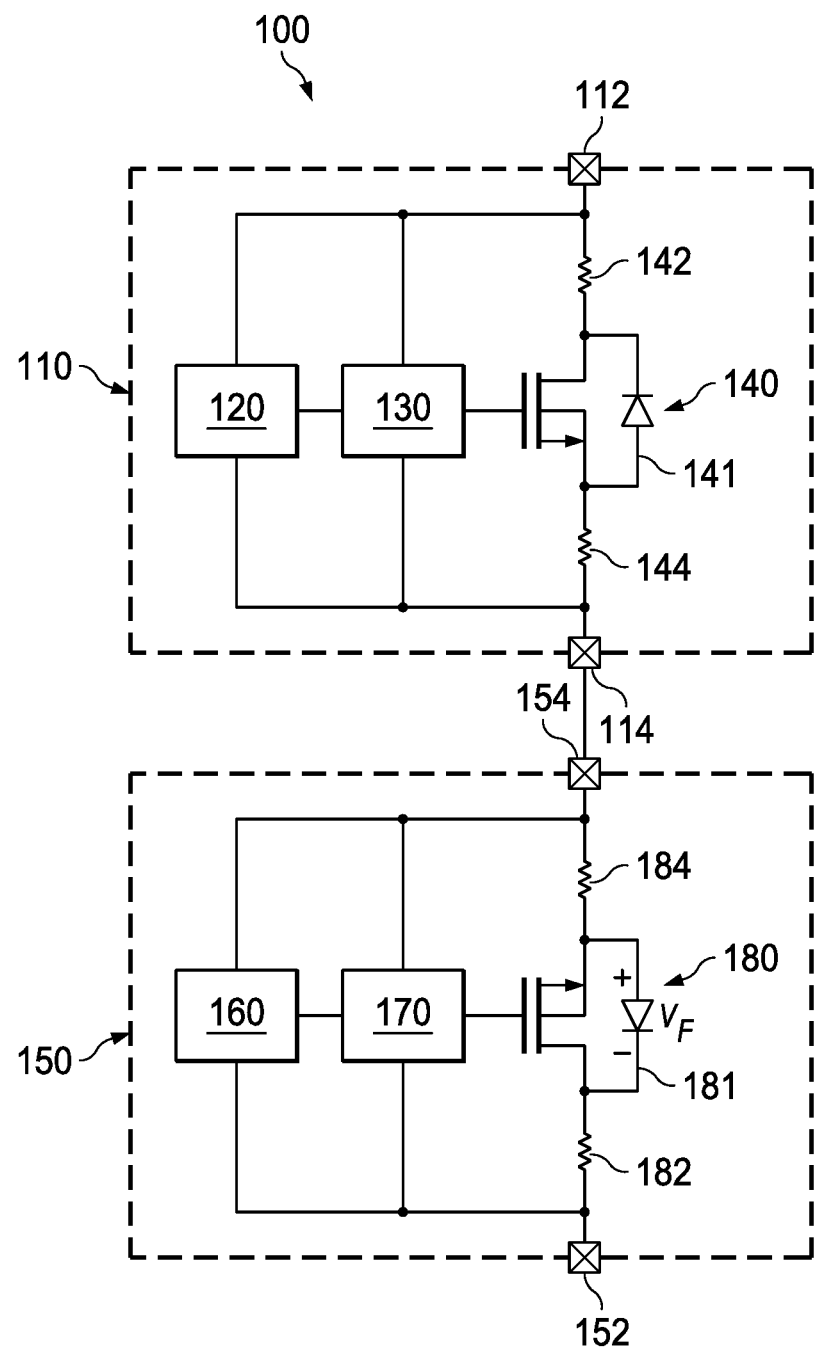
FIG. 1 shows a schematic diagram of a surge protection device according to an aspect of the present disclosure.

For example, as shown in FIG. 1, a surge protection device 100 may include a first surge clamp device 110 and a second surge claim device 150. The first surge clamp device 110 includes a voltage sense circuit 120, a driver circuit 130, and a transistor 140 coupled between a first pin 112 and a second pin 114. The transistor 140 is configured to conduct a current from the first pin 112 to the second pin 114 when its gate terminal receives an ON voltage (e.g., Gate-source voltage ($V_{GS}$)≥Threshold voltage $V_{TH}$). The transistor 140 is configured to be turned off when its gate terminal receives an OFF voltage (e.g., Gate-source voltage ($V_{GS}$)<Threshold voltage $V_{TH}$). However, the body diode 141 (e.g., p-body to n-drain) of the transistor 140 may be under a forward bias when the potential at the second pin 114 is higher than the potential at the first pin 112. Under this forward bias, the body diode 141 is configured to conduct a current from the second pin 114 to the first pin 112.

The second surge clamp device 150 has a back-to-back configuration with the first surge clamp device 110 to provide bidirectional surge protection. In one implementation, for example, the second surge clamp device 150 includes a first pin 152 and a second pin 154, such that the first pins 112 and 152 of the first and second surge clamp devices 110 and 150 are coupled to receive a first voltage and a second voltage, and such that the second pins 114 and 154 of the first and second surge clamp devices 110 and 150 are coupled to each other. In this back-to-back configuration, the first and second surge clamp devices 110 and 150 are configured to protect a positive voltage surge and a negative voltage surge between the first pins 112 and 152.

Like the first surge clamp device 110, the second surge clamp device 150 also includes a voltage sense circuit 160, a driver circuit 170, and a transistor 180 coupled between a first pin 152 and a second pin 154. The transistor 180 is configured to conduct a current from the first pin 152 to the second pin 154 when its gate terminal receives an ON voltage (e.g., Gate-source voltage ($V_{GS}$)≥Threshold voltage $V_{TH}$). The transistor 180 is configured to be turned off when its gate terminal receives an OFF voltage (e.g., Gate-source voltage ($V_{GS}$)<Threshold voltage $V_{TH}$). However, the body diode 181 (e.g., p-body to n-drain) of the transistor 180 may be under a forward bias when the potential at the second pin 154 is higher than the potential at the first pin 152. Under this forward bias, the body diode 181 is configured to conduct a current from the second pin 154 to the first pin 152.

During a positive surge event (e.g., voltage at the first pin 112 is greater than voltage at the first pin 152 by a breakdown voltage (BV), the voltage sensing circuit 120 serves as a means for detecting the onset of the surge event by sensing a voltage across the first and second pins 112 and 114. At the same time, the driver circuit 130 serves as a means for amplifying a sense signal received from the voltage sensing circuit 120, and for delivering the amplified signal to the transistor 140. To protect a downstream device from the surge event, the transistor 140 serves as a means for conducting a surge current. Although the transistor 180 is turned off during the positive surge event, the body diode 181 of the transistor 180 is under forward bias, and it will conduct the surge current from the second pin 154, which is received from the second pin 114, to the first pin 152. Together, the first and second voltage clamp devices 110 and 150 serve as a means for clamping the positive voltage across the first pin 112 and the first pin 152.

The voltage sensing circuit 120 and the driver circuit 130 serve as a means for providing a feedback signal to control the surge current conduction of the transistor 140. This feedback mechanism allows the transistor 140 to respond dynamically according to the surge voltage across the first and second pins 112 and 114. And through this dynamic response, the dynamic resistance of the first surge clamp device 110 may be reduced when compared to the diode-only TVS clamps, especially during the positive surge event as described above.

And during a negative surge event (e.g., voltage at the first pin 112 is less than voltage at the first pin 152 by a BV value), the voltage sensing circuit 160 serves as a means for detecting the onset of the surge event by sensing a voltage across the first and second pins 152 and 154. At the same time, the driver circuit 170 serves as a means for amplifying a sense signal received from the voltage sensing circuit 160, and for delivering the amplified signal to the transistor 180. To protect a downstream device from the surge event, the transistor 180 serves as a means for conducting a surge current. Although the transistor 140 is turned off during the negative surge event, the body diode 141 of the transistor 140 is under forward bias, and it will conduct the surge current from the second pin 114, which is received from the second pin 154, to the first pin 112. Together, the first and second voltage clamp devices 110 and 150 serve as a means for clamping the negative voltage across the first pin 112 and the first pin 152.

The voltage sensing circuit 160 and the driver circuit 170 serve as a means for providing a feedback signal to control the surge current conduction of the transistor 180. This feedback mechanism allows the transistor 180 to respond dynamically according to the surge voltage across the first and second pins 152 and 154. And through this dynamic response, the dynamic resistance of the second surge clamp device 150 may be reduced when compared to the diode-only TVS clamps, especially during the negative surge event as described above.

Although the surge protection device 100 helps reduce dynamic resistance of a surge clamp when a feedback mechanism is activated, a portion of the surge protection device 100 may still incur a relatively high dynamic resistance where the feedback mechanism is not activated. For instance, during a positive surge event, the dynamic resistance across the transistor 180 may be relatively high because of the voltage drop (e.g., forward bias voltage $V_F$) across the body diode 181 and across the parasitic resistance of metal routings 182 and 184. Depending on the amount of surge current being conducted, the voltage drop may range from 2V to 3V. When compared to the parasitic voltage drop, the forward bias voltage $V_F$ may contribute more to the flattening of the I-V curve during the positive surge event, which may in turn increase the dynamic resistance by more than 200%.

Likewise, during a negative surge event, the dynamic resistance across the transistor 140 may be relatively high because of the voltage drop (e.g., forward bias voltage $V_F$) across the body diode 141 and across the parasitic resistance of metal routings 142 and 144. Depending on the amount of surge current being conducted, the voltage drop may range from 2V to 3V. When compared to the parasitic voltage drop, the forward bias voltage $V_F$ may contribute more to the flattening of the I-V curve during the negative surge event, which may in turn increase the dynamic resistance by more than 200%.

This high dynamic resistance of the forward bias diode may be attributable to the configuration of the voltage sensing circuits 120 and 160. In particular, the voltage sensing circuits 120 and 160 are each coupled to their respective substrate (not shown) via their respective second pin 114 or 154. That way, the feedback mechanism of the first surge clamp device 110 is not triggered by, and does not track, the entire voltage drop across the second and first pins 154 and 152. And similarly, the feedback mechanism of the second surge clamp device is not triggered by, and does not track, the entire voltage drop across the second and first pins 114 and 112.

To address the above issues related to high dynamic resistance, the present disclosure introduces a surge protection architecture to provide bidirectional surge protection with near-zero dynamic resistance and ultra-low leakage current. In one implementation, for example, the disclosed surge protection architecture includes a positive voltage sensing circuit and a negative voltage sensing circuit, both of which are coupled between a pair of external pins for detecting a surge event, yet neither of which is coupled to the internal substrate of an integrated circuit die. Advantageously, both the positive and negative voltage sensing circuits are able to detect, and thus respond to, the entire voltage drop across the pair of pins.

When the voltage across the pair of external pins exceeds a positive threshold (e.g., a particular breakdown voltage BV), the positive voltage sensing circuit is configured to activate a first power transistor to conduct a surge current from the first pin to the second pin. Likewise, when the voltage across the pair of external pins exceeds a negative threshold (e.g., a particular reverse breakdown voltage −BV), the negative voltage sensing circuit is configured to activate a second transistor to conduct a surge current from the second pin to the first pin. That way, the voltage across the pair of external pins may be kept at a range between −BV and BV. By regulating the voltage range across the pair of external pin, the disclosed surge protection architecture is configured to cancel out the voltage drop $V_F$ across the forward body diode (e.g., 141 or 181) plus the voltage drop across the metal routing (e.g., 142 and 144, or 182 and 184) of the inactivated transistor (e.g., 140 or 180). Advantageously, the disclosed architecture significantly reduces the dynamic resistance by accounting for, and thus compensating, the forward bias voltage drop $V_F$ and the parasitic routing voltage drop across an inactivated portion of the voltage sensing circuit.

Figure 2:
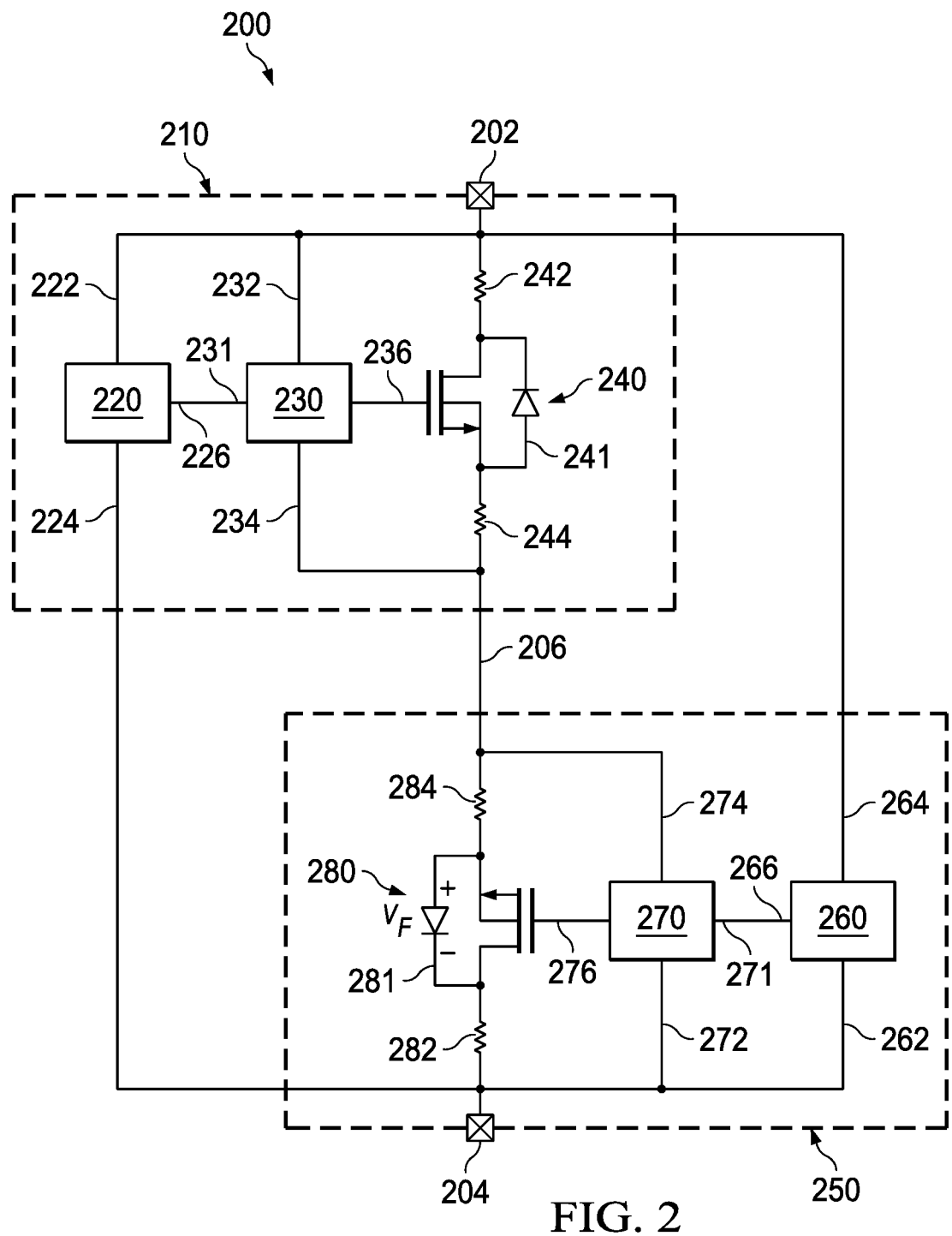
FIG. 2 shows a schematic diagram of a surge protection device with near-zero dynamic resistance and low leakage current according to an aspect of the present disclosure.

FIG. 2 shows a schematic diagram of a surge protection device 200 with near-zero dynamic resistance and low leakage current according to an aspect of the present disclosure. The surge protection device 200 includes a first pin 202 and a second pin 204 for receiving a voltage, which can be a supply voltage or a signal voltage for a downstream device. In one implementation, for example, the first pin 202 can be a protected pin that is configured to be coupled to a protected circuit within the downstream device, whereas the second pin 204 can be a ground pin that is coupled to a ground reference source (e.g., 0v).

The surge protection device 200 includes a first surge protection circuit 210 and a second surge protection circuit 250 having a mirror-stagger configuration with the first surge protection circuit 210. The first surge protection circuit 210 serves as a means for clamping the first and second pins 202 and 204 at a positive clamping voltage during a positive surge event. In one implementation, the first surge protection circuit 210 includes a voltage sensing circuit 220, a driver circuit 230, and a transistor 240. The second surge protection circuit 250 serves as a means for clamping the first and second pins 202 and 204 at a negative clamping voltage during a negative surge event. In one implementation, the second surge protection circuit 210 includes a voltage sensing circuit 260, a driver circuit 270, and a transistor 280. The surge protection device 200 may be implemented as a single integrated circuit die to provide a monolithic solution for bidirectional precision surge clamp with near-zero dynamic resistance and ultra-low leakage current. In a single-die implementation, the surge protection device 200 includes a substrate accessible by the first and second surge protection circuits 210 and 250 at a substrate node (or middle node) 206.

Alternatively, the surge protection device 200 may be implemented as a system with multiple integrated circuit dies. For instance, the first surge protection circuit 210 may be implemented by a first integrated circuit die, whereas the second surge protection circuit 250 may be implemented by a second integrated circuit die. In a two-die implementation, the surge protection device 200 includes two substrates accessible by the first and second surge protection circuits 210 and 250 at a substrate node (or middle node) 206. Depending on a particular system implementation, the first and second integrated circuit dies can be mounted in a single package or on a printed circuit board.

Unlike the first surge protection circuit 110 as shown in FIG. 1, the first surge protection circuit 210 has direct access to the second pin 204. In particular, the voltage sensing circuit 220 has a first input terminal 222 coupled to the first pin 202, a second input terminal 224 coupled to the second pin 204, and a sense output node 226 coupled to the driver circuit 230. Unlike the voltage sensing circuit 120, the voltage sensing circuit 220 is not directly coupled to the substrate node (or middle node) 206. Instead, the transistor 280 of the second surge protection circuit 250 interfaces between the second input terminal 224 of the voltage sensing circuit 220 and the substrate node 206. That way, the voltage sensing circuit 220 is interposed from the substrate node 206 by the transistor 280, such that the voltage at the substrate node 206 is not directly detected by the voltage sensing circuit 220.

When enabled, the voltage sensing circuit 220 is configured to detect a positive voltage of the first pin 202 relative to the second pin 204. Based on this detection, the voltage sensing circuit 220 is configured to generate a sense signal when the detected voltage exceeds a preset threshold. For instance, the present threshold may include a positive voltage greater than 0V. The voltage sensing circuit 220 is configured to deliver or output the sense signal at the sense output node 226.

The driver circuit 230 includes a driver input node 231, a driver output node 236, a first supply terminal 232 and a second supply terminal 234. The first input node 231 is coupled to the sense output node 226 for receiving the sense signal from the voltage sensing circuit 210. The first supply terminal 232 is coupled to the first pin 202, and the second supply terminal 234 is coupled to the substrate node 206. The first and second supply terminals 232 and 234 is configured to receive a supply voltage for amplifying the sense signal to generate a gate driver signal. The driver output node 236, which is coupled to a gate terminal of the transistor 240, is for delivering the gate driver signal to adjust a surge current conducted by the transistor 240.

The transistor 240 can be any type of transistor that is capable of conducting a designated amount of surge current based on the gate driver signal received from the driver circuit 230. In one implementation, for example, the transistor 240 can be an n-channel metal oxide semiconductor field effect transistor (MOSFET). In another implementation, for example, the transistor 240 can be a power MOSFET. In yet another implementation, for example, the transistor 240 can be a drain extended transistor.

In general, the transistor 240 includes a drain terminal coupled to the first pin 202 via a drain conductive routing 242, a source terminal coupled to the substrate node (or middle node) 206 via a source conductive routing 244, and a gate terminal coupled to the driver output node 236 of the driver circuit 230. The drain and source conductive routings 242 and 244 may each include parasitic resistance, which will develop a potential difference while conducting a current.

Depending on the internal arrangement of doped regions, the transistor 240 may include one or more body diodes. In an arrangement where a p-doped body adjacent to an n-doped drain region, the transistor 240 includes a body diode 241, which has an anode coupled to the substrate node 206 and a cathode coupled to first pin 202. Moreover, in the event that the source terminal is coupled to the body region of the transistor 240, the anode of the body diode 241 may include the source terminal as well, which is coupled to the substrate node 206 via the source conductive routing 244. Likewise, the cathode of the body diode 241 is coupled to the first pin 202 via the drain conductive routing 242.

The second surge protection circuit 250 may include the identical circuit components as the first surge protection circuit 210, thought the second surge protection circuit 250 is arranged in a mirror-stagger fashion with respect to the first surge protection circuit 210.

Unlike the second surge protection circuit 150 as shown in FIG. 1, the second surge protection circuit 250 has direct access to the first pin 202. In particular, the voltage sensing circuit 260 has a first input terminal 262 coupled to the second pin 204, a second input terminal 264 coupled to the first pin 202, and a sense output node 266 coupled to the driver circuit 270. Unlike the voltage sensing circuit 160, the voltage sensing circuit 260 is not directly coupled to the substrate node (or middle node) 206. Instead, the transistor 240 of the first surge protection circuit 210 interfaces between the second input terminal 264 of the voltage sensing circuit 260 and the substrate node 206. That way, the voltage sensing circuit 260 is interposed from the substrate node 206 by the transistor 240, such that the voltage at the substrate node 206 is not directly detected by the voltage sensing circuit 260.

When enabled, the voltage sensing circuit 260 is configured to detect a negative voltage of the first pin 202 relative to the second pin 204. Based on this detection, the voltage sensing circuit 260 is configured to generate a sense signal when the detected voltage exceeds a preset threshold. For instance, the present threshold may include a negative voltage, which is less than 0V. The voltage sensing circuit 260 is configured to deliver or output the sense signal at the sense output node 266.

The driver circuit 270 includes a driver input node 271, a driver output node 276, a first supply terminal 272 and a second supply terminal 274. The first input node 271 is coupled to the sense output node 266 for receiving the sense signal from the voltage sensing circuit 250. The first supply terminal 272 is coupled to the first pin 202, and the second supply terminal 274 is coupled to the substrate node 206. The first and second supply terminals 272 and 274 is configured to receive a supply voltage for amplifying the sense signal to generate a gate driver signal. The driver output node 276, which is coupled to a gate terminal of the transistor 280, is for delivering the gate driver signal to adjust a surge current conducted by the transistor 280.

The transistor 280 can be any type of transistor that is capable of conducting a designated amount of surge current based on the gate driver signal received from the driver circuit 270. In one implementation, for example, the transistor 280 can be an n-channel metal oxide semiconductor field effect transistor (MOSFET). In another implementation, for example, the transistor 280 can be a power MOSFET. In yet another implementation, for example, the transistor 280 can be a drain extended transistor. In still another implementation, for example, the transistor 280 can be a bipolar junction transistor.

In general, the transistor 280 includes a drain terminal coupled to the second pin 204 via a drain conductive routing 282, a source terminal coupled to the substrate node (or middle node) 206 via a source conductive routing 284, and a gate terminal coupled to the driver output node 276 of the driver circuit 270. The drain and source conductive routings 282 and 284 may each include parasitic resistance, which will develop a potential difference while conducting a current.

Depending on the internal arrangement of doped regions, the transistor 280 may include one or more body diodes. In an arrangement where a p-doped body adjacent to an n-doped drain region, the transistor 280 includes a body diode 281, which has an anode coupled to the substrate node 206 and a cathode coupled to second pin 204. Moreover, in the event that the source terminal is coupled to the body region of the transistor 280, the anode of the body diode 281 may include the source terminal as well, which is coupled to the substrate node 206 via the source conductive routing 284. Likewise, the cathode of the body diode 281 is coupled to the second pin 204 via the drain conductive routing 282.

Within the surge protection architecture as shown in FIG. 2, the positive voltage sensing circuit 220 and the negative voltage sensing circuit 260 are both coupled between a pair of protected pins 202 and 204 for detecting a surge event, yet neither of circuit 202 nor 260 is directly coupled to the substrate node 206 of the surge protection device 200. When the voltage across the pair of protected pins 202 and 204 exceeds a positive threshold (e.g., a particular breakdown voltage (BV) of a downstream device), the positive voltage sensing circuit 220 will activate the first power transistor 240 to conduct a surge current from the first pin 202 to the substrate node 206, which then delivers the current to the second pin 204 via the second body diode 281. Likewise, when the voltage across the pair of external pins exceeds a negative threshold (e.g., a particular reverse breakdown voltage (−BV) of a downstream device), the negative voltage sensing circuit 260 will activate the second transistor 280 to conduct a surge current from the second pin 204 to the substrate node 206, which then delivers the current to the first pin 202 via the first body diode 241.

That way, the voltage across the pair of protected pins 202 and 204 may be kept at a range between −BV and BV. By regulating the voltage range across the pair of protected pins 202 and 204, the surge protection device 200 is configured to cancel out the voltage drop $V_F$ across the forward body diode (e.g., 241 or 281) plus the voltage drop across the metal routing (e.g., 242 and 244, or 282 and 284) of the inactivated transistor (e.g., 240 or 280). Advantageously, the surge protection device 200 significantly reduce the dynamic resistance by mitigating or suppressing the forward bias voltage drop $V_F$ and the parasitic routing voltage drop. And by reducing the dynamic resistance, the surge protection device 200 also enhances the precision of voltage clamping at the first and second pins 202 and 204, as well as reducing the leakage current across the first and second transistors 240 and 280.

Figure 3:
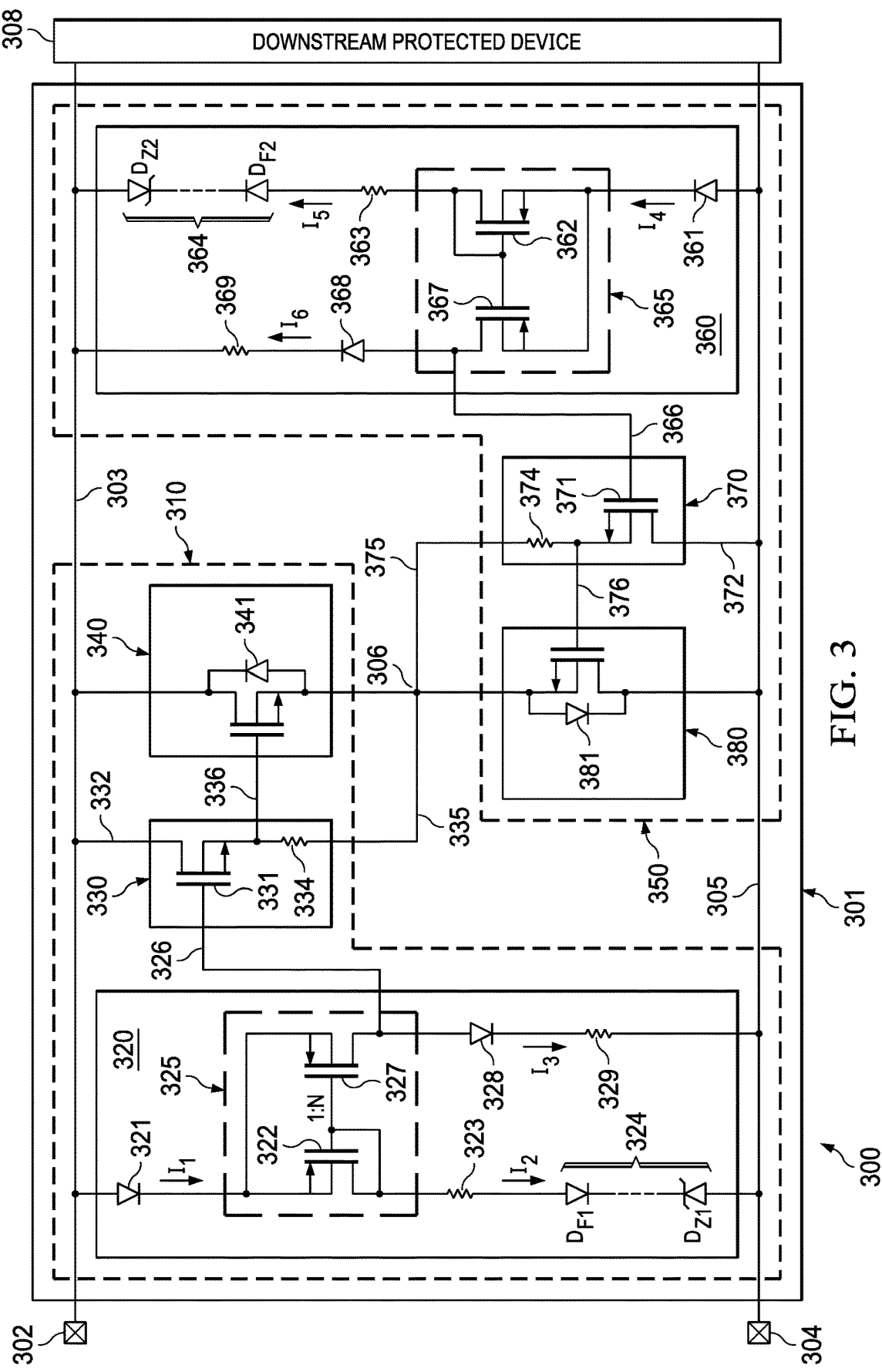
FIG. 3 shows a schematic diagram of an electronic system protected by a surge protection device according to an aspect of the present disclosure.

FIG. 3 shows a schematic diagram of an electronic system 300 protected by a surge protection device 301 according to an aspect of the present disclosure. The surge protection device 301 has substantially the same topology and architecture as the surge protection device 200 as described in FIG. 2. As such, the surge protection device 301 is configured to perform substantially the same function and deliver substantially the same benefit as the surge protection device 200. In addition, the surge protection device 301 incorporate specific circuit implementations for the voltage sensing circuit (e.g., 220 and 260) and the driver circuit (e.g., 230 and 270), each of which is configured to perform the prescribed functions of the surge protection device 200 in a specific manner. Notwithstanding the specific circuit implementations as incorporated by the surge protection device 301, other configurations are possible and thus not excluded by the present disclosure, so long as these other configurations are consistent with the description of FIG. 2.

Because of its versatility and high performance, the surge protection device 301 may be adopted to protect various applications in the industrial space, automotive space, medical space, and consumer electronic space. For instance, the electronic system 300 may include, but is not limited to, a power line communication (PLC) module, an industrial transmitter, an electronic medical device, a motor driver, an electrical grid device, a home automation device, a power tool, and an internet protocol (IP) camera.

Depending on the specific application, the first and second pins 302 and 304 of the electronic system 300 may be configured to receive or deliver various types of voltages that can benefit from the surge protection features provided by the surge protection device 301. In a first implementation, for instance, the electronic system 300 may include an industrial transmitter, in which the first and second pins 302 and 304 are configured to receive a voltage signal for an analog front end circuit that is designated as the downstream protected device 308. In a second implementation, for instance, the electronic system 300 may include a PLC module, in which the first and second pins 302 and 304 are configured to receive a voltage supply for an analog front end circuit that is designated as the downstream protected device 308. In a third implementation, for instance, the electronic system 300 may include a motor driver, in which the first and second pins 302 and 304 are configured to deliver a voltage output for an output stage circuit that is designated as the downstream protected device 308. In a fourth implementation, for instance, the electronic system 300 may include a power grid device, in which the first and second pins 302 and 304 are configured to receive a shunt measurement voltage for an analog-to-digital converter (ADC) circuit that is designated as the downstream protected device 308. In a fifth implementation, for instance, the electronic system 300 may include a medical patient monitoring device, in which the first and second pins 302 and 304 are configured to receive a transducer output voltage for an analog front end circuit that is designated as the downstream protected device 308.

Notwithstanding the aforementioned examples, other additional system implementations are possible so long as these implementations are consistent with the functional and structural descriptions of FIGS. 2 and 3. For instance, the first pin 302 can be a protected pin that is configured to be coupled to a circuit in the protected device 308, and the second pin 304 can be a ground pin that is coupled to a ground reference source. Alternatively, both the first and second pins 302 and 304 can be protected pins that are configured to receive a differential voltage, which can either be a signal or a power supply for the protected device 308. Internally, the electronic system 300 may include a first rail 303 and a second rail 305 to provide conductive paths from the first and second pins 302 and 304 to the protected device 308. The surge protection device 301 is configured to protect the protected device 308 from a voltage surge event at the first and second pins 302 and 304. In one configuration, for example, the surge protection device 301 is coupled between the first and second rails 303 and 305.

The surge protection device 300 may be implemented as a single integrated circuit die to provide a monolithic solution for bidirectional precision surge clamp with near-zero dynamic resistance and ultra-low leakage current. In a single-die implementation, the surge protection device 300 includes a substrate accessible by the first and second surge protection circuits 310 and 350 at the substrate node (or middle node) 306.

Alternatively, the surge protection device 300 may be implemented as a system with multiple integrated circuit dies. For instance, the first surge protection circuit 310 may be implemented by a first integrated circuit die, whereas the second surge protection circuit 350 may be implemented by a second integrated circuit die. In a two-die implementation, the surge protection device 300 includes two substrates accessible by the first and second surge protection circuit 310 and 350 at the substrate node (or middle node) 306. Depending on a particular system implementation, the first and second integrated circuit dies can be mounted in a single package or on a printed circuit board.

Like the surge protection device 200, the surge protection device 301 includes a first surge protection circuit 310 and a second surge protection circuit 350 having a mirror-stagger configuration with the first surge protection circuit 310. And like the first surge protection circuit 210, the first surge protection circuit 310 serves as a means for clamping the first and second pins 302 and 304 at a positive clamping voltage. In one implementation, the first surge protection circuit 310 includes a voltage sensing circuit 320, a driver circuit 330, and a transistor 340. The voltage sensing circuit 320 is configured to perform substantially the same functions as the voltage sensing circuit 220 and with additional features as described below. Likewise, the driver circuit 330 is configured to perform substantially the same functions as the driver circuit 230 and with additional features as described below.

Moreover, the transistor 340 is configured in a similar fashion as the transistor 240 and to perform substantially the same functions as the transistor 240. Although the conductive routings 242 and 244 are not shown within the first surge protection circuit 310, they may be configured in a similar way as shown in FIG. 2. Like the transistor 240, the transistor 340 can be any type of transistor that is capable of conducting a designated amount of surge current based on the gate driver signal received from the driver circuit 330. In one implementation, for example, the transistor 340 can be an n-channel metal oxide semiconductor field effect transistor (MOSFET). In another implementation, for example, the transistor 340 can be a power MOSFET. In yet another implementation, for example, the transistor 340 can be a drain extended transistor.

The transistor 340 includes a drain terminal coupled to the first pin 302, a source terminal coupled to the substrate node (or middle node) 306, and a gate terminal coupled to the driver circuit 330. Depending on the internal arrangement of doped regions, the transistor 340 may include one or more body diodes. In an arrangement where a p-doped body adjacent to an n-doped drain region, the transistor 340 includes a body diode 341, which has an anode coupled to the substrate node 306 and a cathode coupled to first pin 302. Moreover, in the event that the source terminal is coupled to the body region of the transistor 340, the anode of the body diode 341 may include the source terminal as well, which is also coupled to the substrate node 306.

The voltage sensing circuit 320 includes a first current path I1, a second current path I2, and a third current path I3. The first current path I1 is a main current path extended from the first pin 302. The first current path I1 includes a first diode 321 having an anode coupled to the first pin 302 and a cathode coupled to a current mirror 325, from which the second current path I2 and the third current path I3 are diverging. The second current path I2 is an extension of the first current path I1 such that it may also be referred to as a part of the first current path I1. The second current path I2 is a reference current path as it is configured to conduct a reference current based on a positive voltage between the first pin 302 and the second pin 304. In one implementation, the second current path I2 includes a first transistor 322, a first resistor 323, and a voltage clamp circuit 324.

The first transistor 322 serves as a means for conducting a reference current in a current mirror 325. As such, the first transistor 322 may be referred to as a reference transistor. The reference transistor 322 may be a p-channel transistor having a gate terminal, a drain terminal coupled to the gate terminal, and a source terminal coupled to the cathode of the first diode 321. The first resistor 323 is coupled in series between the drain terminal of the first transistor 322 and the voltage clamp circuit 324.

The voltage clamp circuit 324 is configured to set a positive clamp voltage between the first and second pins 302 and 304. In one implementation, for example, the voltage clamp circuit 324 includes a series of Zener diode $D_{Z1}$ and forward bias diode $D_{F1}$ according to a positive voltage from the first pin 302 to the second pin 304. Based on the aggregated bias voltages across these diodes $D_{Z1}$ and $D_{F1}$, the voltage clamp circuit 324 presets a positive threshold voltage to be sensed across the first pin 302 and second pin 304. In one implementation, for example, the voltage clamp circuit 324 may include one Zener diode $D_{Z1}$ having a reverse bias voltage 6.7V, and two forward bias diodes $D_{F1}$ each having a forward bias voltage of 0.8V. Together, the Zener diode $D_{Z1}$ and the forward bias diodes $D_{F1}$ preset a positive threshold voltage of at least 8.3V across the first and second pins 302 and 304.

The positive threshold voltage is adjustable by variant combinations of reverse Zener diodes $D_{Z1}$ and forward diodes $D_{F1}$. And the adjusted positive threshold voltage will help set a clamp voltage for triggering the voltage sensing circuit 320 to generate a sensing signal. FIG. 3 shows in one configuration, the voltage clamp circuit 324 is coupled in series between the first resistor 323 and the second pin 304. In another configuration, the voltage clamp circuit 324 may switch position with the first resistor 323, such that the voltage clamp circuit 324 is coupled in series between the reference transistor 322 and the first resistor 323.

Moreover, the series of diodes $D_{Z1}$ and $D_{F1}$ are selected to have an aggregated temperature coefficient that is substantially equal to zero. In one implementation, for example, the voltage clamp circuit 324 may include one Zener diode $D_{Z1}$ having a positive temperature coefficient of 3.45 mV/C, and two forward bias diodes $D_{F1}$ each having a negative temperature coefficient of 1.45 mV/C. The aggregated temperature coefficient of the voltage clamp circuit 324 is about 0.55 mV/C, which is within a range that is substantially equal to zero.

The third current path I3 is coupled to the first current path I1, and it is configured to divide the current of the first current path I1 with the second current path I2. Dependent on the transistor ratio 1:N, the third current path I3 is configured to mirror and upscale the current in the second current path I2 by a factor of N. For the sake of consistency but without loss of generality, the terms first current path I1, the second current path I2, and the third current path I3 are used as placeholders for describing several circuit branches. These terms however, are not affixed to any particular circuitry or circuit element. In one nomenclature, for instance, the current path I1 and the current path I2 can be collectively referred to as a first current path, whereas the current path I3 may be referred to as a second path. Such an example nomenclature is consistent with the scope of the present disclosure.

The third current path I3 includes a second transistor 327, a second diode 328, and a second resistor 329. The second transistor 327 is coupled between the first diode 321 and the second diode 328. The second diode 328 has an anode coupled to the drain terminal of the second transistor 327, and a cathode coupled to the second resistor 329. Like the first diode 321, the second diode 328 has a forward bias configuration orienting from the first pin 302 to the second pin 304. FIG. 3 shows in one configuration, the second diode 328 is coupled in series between the second transistor 327 and the second resistor 329. In another configuration, the second diode 328 may switch position with the second resistor 329, such that the second diode 328 is coupled in series between the second resistor 329 and the second pin 304.

The second transistor 327 serves as a means for conducting a mirror current in the current mirror 325. As such, the second transistor 327 may be referred to as a mirror transistor. The mirror transistor 327 may be a p-channel transistor having a gate terminal coupled to the gate terminal of the reference transistor 322, a source terminal coupled to the cathode of the first diode 321, and a drain terminal coupled to a sense output node 326. The mirror transistor 327 may have an aggregated width that is N times of the aggregated width of the reference transistor 322. To realize this ratio, the mirror transistor 327 may include a bank of N transistors coupled in parallel, and each having a transistor width that is substantially the same as the transistor width of the reference transistor 322. The transistor width ratio N can be selected to define a sensitivity of the voltage sensing circuit 320. In one implementation, for example, the transistor width ratio N may be greater than 1. In another implementation, for example, the transistor width ratio N may range from 1 to 20. In yet another implementation, for example, the transistor width ratio N may be 6.

The driver circuit 330 is coupled between the third current path I3 and the gate terminal of the transistor 340. More specifically, the sense output node 326 of the third current path I3 is coupled to the gate terminal of the transistor 340 via the driver circuit 330. The driver circuit 330 serves as a means for amplifying the sensing signal at the sense output node 326 to generate a gate driver signal for driving the transistor 340. In one implementation, the driver circuit 330 includes an amplifier circuit having a source follower configuration. The source follower circuit has an input coupled to the sense output node 326 of the third current path I3, and an output coupled to the gate terminal of the transistor 340. To provide a supply voltage for the source follower circuit, the driver circuit 330 includes a first voltage supply line 332 coupled to the first pin 302, and a second voltage supply line 335 coupled to the substrate node 306. And to realize the source follower circuit, the driver circuit 330 includes a transistor 331 having a drain terminal coupled to the first voltage supply line 332, a gate terminal coupled to the sense output node 326, and a source terminal to be followed by a resistor 334. The driver circuit 330 includes a driver output node 336 coupled between the source terminal of the transistor 331 and the resistor 334. Although FIG. 3 shows the driver circuit 330 is implemented by a source follower configuration, other amplification configurations may be implemented to realize the functional features of the driver circuit 330 as well.

Referring now to the second surge protection circuit 350, it is configured to perform substantially the same functions as the second surge protection circuit 250 as described in FIG. 2. For example, the second surge protection circuit 350 serves as a means for clamping the first and second pins 302 and 304 at a negative clamping voltage. In one implementation, the second surge protection circuit 350 includes a voltage sensing circuit 360, a driver circuit 370, and a transistor 380. The voltage sensing circuit 360 is configured to perform substantially the same functions as the voltage sensing circuit 260 and with additional features as described below. Likewise, the driver circuit 370 is configured to perform substantially the same functions as the driver circuit 270 and with additional features as described below.

Moreover, the transistor 380 is configured in a similar fashion as the transistor 280 and to perform substantially the same functions as the transistor 280. Although the conductive routings 282 and 284 are not shown within the first surge protection circuit 350, they may be configured in a similar way as shown in FIG. 2. Like the transistor 280, the transistor 380 can be any type of transistor that is capable of conducting a designated amount of surge current based on the gate driver signal received from the driver circuit 370. In one implementation, for example, the transistor 380 can be an n-channel metal oxide semiconductor field effect transistor (MOSFET). In another implementation, for example, the transistor 380 can be a power MOSFET. In yet another implementation, for example, the transistor 380 can be a drain extended transistor.

The transistor 380 includes a drain terminal coupled to the second pin 304, a source terminal coupled to the substrate node (or middle node) 306, and a gate terminal coupled to the driver circuit 370. Depending on the internal arrangement of doped regions, the transistor 380 may include one or more body diodes. In an arrangement where a p-doped body adjacent to an n-doped drain region, the transistor 380 includes a body diode 381, which has an anode coupled to the substrate node 306 and a cathode coupled to second pin 304. Moreover, in the event that the source terminal is coupled to the body region of the transistor 380, the anode of the body diode 381 may include the source terminal as well, which is coupled to the substrate node 306.

The voltage sensing circuit 360 includes a first current path I4, a second current path I5, and a third current path I6. The first current path I4 is a main current path extended from the second pin 304. The first current path I4 includes a first diode 361 having an anode coupled to the second pin 304 and a cathode coupled to a current mirror 365, from which the second current path I5 and the third current path I6 are diverging. The second current path I5 is an extension of the first current path I4 such that it may also be referred to as a part of the first current path I4. The second current path I5 is a reference current path as it is configured to conduct a reference current based on a negative voltage between the first pin 302 and the second pin 304. In one implementation, the second current path I5 includes a first transistor 362, a first resistor 363, and a voltage clamp circuit 364.

The first transistor 362 serves as a means for conducting a reference current in a current mirror 365. As such, the first transistor 362 may be referred to as a reference transistor. The reference transistor 362 may be a p-channel transistor having a gate terminal, a drain terminal coupled to the gate terminal, and a source terminal coupled to the cathode of the first diode 361. The first resistor 363 is coupled in series between the drain terminal of the first transistor 362 and the voltage clamp circuit 364.

The voltage clamp circuit 364 is configured to set a negative clamp voltage between the first and second pins 302 and 304. In one implementation, for example, the voltage clamp circuit 364 includes a series of Zener diode $D_{Z2}$ and forward bias diode $D_{F2}$ according to a negative voltage from the first pin 302 to the second pin 304. Based on the aggregated bias voltages across these diodes $D_{Z2}$ and $D_{F2}$, the voltage clamp circuit 364 presets a negative threshold voltage to be sensed across the first pin 302 and second pin 304. In one implementation, for example, the voltage clamp circuit 364 may include one Zener diode $D_{Z2}$ having a reverse bias voltage 6.7V, and two forward bias diodes $D_{F2}$ each having a forward bias voltage of 0.8V. Together, the Zener diode $D_{Z2}$ and the forward bias diodes $D_{F2}$ preset a negative threshold voltage of at least −8.3V across the first and second pins 302 and 304.

The negative threshold voltage is adjustable by trimming the first resistor 363. And the adjusted negative threshold voltage will help set a clamp voltage for triggering the voltage sensing circuit 360 to generate a sensing signal. FIG. 3 shows in one configuration, the voltage clamp circuit 364 is coupled in series between the first resistor 363 and the first pin 302. In another configuration, the voltage clamp circuit 364 may switch position with the first resistor 363, such that the voltage clamp circuit 364 is coupled in series between the reference transistor 362 and the first resistor 363.

Moreover, the series of diodes $D_{Z2}$ and $D_{F2}$ are selected to have an aggregated temperature coefficient that is substantially equal to zero. In one implementation, for example, the voltage clamp circuit 364 may include one Zener diode $D_{Z2}$ having a positive temperature coefficient of 3.45 mV/C, and two forward bias diodes $D_{F2}$ each having a negative temperature coefficient of 1.45 mV/C. The aggregated temperature coefficient of the voltage clamp circuit 364 is about 0.55 mV/C, which is within a range that is substantially equal to zero.

The third current path I6 is coupled to the first current path I4, and it is configured to divide the current of the first current path I4 with the second current path I5. Dependent on the transistor ratio 1:N, the third current path I6 is configured to mirror and upscale the current in the second current path I5 by a factor of N. For the sake of consistency but without loss of generality, the terms first current path I4, the second current path I5, and the third current path I6 are used as placeholders for describing several circuit branches. These terms however, are not affixed to any particular circuitry or circuit element. In one nomenclature, for instance, the current path I4 and the current path I5 can be collectively referred to as a first current path, whereas the current path I6 may be referred to as a second path. Such an example nomenclature is consistent with the scope of the present disclosure.

The third current path I6 includes a second transistor 367, a second diode 368, and a second resistor 369. The second transistor 367 is coupled between the first diode 361 and the second diode 368. The second diode 368 has an anode coupled to the drain terminal of the second transistor 367, and a cathode coupled to the second resistor 369. Like the first diode 361, the second diode 368 has a forward bias configuration orienting from the second pin 304 to the first pin 302. Moreover, like the first resistor 363, the second resistor 369 may include trim options. FIG. 3 shows in one configuration, the second diode 368 is coupled in series between the second transistor 367 and the second resistor 369. In another configuration, the second diode 368 may switch position with the second resistor 369, such that the second diode 368 is coupled in series between the second resistor 369 and the first pin 302.

The second transistor 367 serves as a means for conducting a mirror current in the current mirror 365. As such, the second transistor 367 may be referred to as a mirror transistor. The mirror transistor 367 may be a p-channel transistor having a gate terminal coupled to the gate terminal of the reference transistor 362, a source terminal coupled to the cathode of the first diode 361, and a drain terminal coupled to a sense output node 366. The mirror transistor 367 may have an aggregated width that is N times of the aggregated width of the reference transistor 362. To realize this ratio, the mirror transistor 367 may include a bank of N transistors coupled in parallel, and each having a transistor width that is substantially the same as the transistor width of the reference transistor 362. The transistor width ratio N can be selected to define a sensitivity of the voltage sensing circuit 360. In one implementation, for example, the transistor width ratio N may be greater than 1. In another implementation, for example, the transistor width ratio N may range from 1 to 20. In yet another implementation, for example, the transistor width ratio N may be 6.

The driver circuit 370 is coupled between the third current path I6 and the gate terminal of the transistor 380. More specifically, the sense output node 366 of the third current path I6 is coupled to the gate terminal of the transistor 380 via the driver circuit 370. The driver circuit 370 serves as a means for amplifying the sensing signal at the sense output node 366 to generate a gate driver signal for driving the transistor 380. In one implementation, the driver circuit 370 includes an amplifier circuit having a source follower configuration. The source follower circuit has an input coupled to the sense output node 366 of the third current path I6, and an output coupled to the gate terminal of the transistor 380. To provide a supply voltage for the source follower circuit, the driver circuit 370 includes a first voltage supply line 372 coupled to the second pin 304, and a second voltage supply line 374 coupled to the substrate node 306. And to realize the source follower circuit, the driver circuit 370 includes a transistor 371 having a drain terminal coupled to the first voltage supply line 372, a gate terminal coupled to the sense output node 366, and a source terminal to be followed by a resistor 374. The driver circuit 370 includes a driver output node 376 coupled between the source terminal of the transistor 371 and the resistor 374. Although FIG. 3 shows the driver circuit 370 is implemented by a source follower configuration, other amplification configurations may be implemented to realize the functional features of the driver circuit 370 as well.

As described previously, a positive voltage surge occurs when the voltage at the first pin 302 is greater than the voltage at the second pin 304 by a positive voltage margin preset by the voltage clamp circuit 324. During a positive voltage surge, the first diode 361 and the second diode 368 are in reverse bias, and they thus serve as blocking diodes to inactive the voltage sensing circuit 360 in the second surge protection circuit 350. In particular, the first diode 361 prevents a leakage current to be conducted by the first current path I4, whereas the second diode 368 protects the gate-to-drain oxide of the second transistor 367 from facing a breakdown voltage.

When the voltage at the first pin 302 exceeds the voltage at the second pin 304 by a substantial margin, a preset positive voltage is developed by the voltage clamp circuit 324 by way of conducting the reference current through the second current path I2. This reference current can be relatively small (e.g., several µA) when compared to the mirror current conducted by the third current path I3. Where the voltage clamp circuit 324 includes the Zener diode $D_{Z1}$ and the forward bias diode $D_{F1}$, the preset positive voltage is established by triggering a reverse bias in the Zener diode $D_{Z1}$ and a forward bias in the forward bias diode $D_{F1}$. The preset positive voltage is also received by the gate of the mirror transistor 327 in the third current path I3, which then pulls up the voltage at the sense output node 326 to generate the sense signal.

The sense signal is then amplified by the driver circuit 330 to generate a gate driver signal, which is delivered at the driver output node 336 for driving the gate terminal of the transistor 340. In a configuration where the transistor 340 has its drain terminal coupled to the first pin 302 and its source terminal coupled to the substrate node 306, the transistor 340 provides a low impedance path that is capable of conducting high surge current without develop a high clamp voltage. The surge current is further conducted by the body diode 381 once the substrate node 306 develops a potential that is greater than the second pin 304 by a forward bias voltage (e.g., 0.7V) of the body diode 381. Collectively, the transistor 340 and the body diode 381 form a low resistance path from the first pin 302 to the second pin 304.

Because the voltage sensing circuit 320 is coupled between the first and second pins 302 and 304, the voltage sensing circuit 320 is dissociated from the substrate node 306 in the surge current path. Advantageously, the voltage sensing circuit 320 is configured to detect the voltage difference between the first and second pins 302 and 304, instead of a partial voltage difference across the first pin 302 and the substrate node 306. This voltage detection scheme is capable of detecting any voltage drop (e.g., $V_F$) across the body diode 381, as well as the voltage drop across the parasitic routing between the first and second pins 302 and 304. That way, the surge protection device 301 may compensate these voltage drops to reduce the dynamic resistance to a near-zero value (e.g., 41 mΩ) during the positive surge event. Advantageously, this dynamic resistance is about 2.8 times less than the dynamic resistance provided by the device 100 in FIG. 1. When the potential difference across the first and second pins 302 and 304 is below the VRWM, the surge protection device 301 sustains a very small amount of leakage current. Yet the surge protection device 301 is capable of providing a robust response to a positive surge by precisely clamping the surge current under a safe operation range (e.g., 30A to 50A) for the downstream protected device 308.

Similarly, a negative voltage surge occurs when the voltage at the first pin 302 is less than the voltage at the second pin 304 by a negative voltage margin preset by the voltage clamp circuit 364. During a negative voltage surge, the first diode 321 and the second diode 328 are in reverse bias, and they thus serve as blocking diodes to inactive the voltage sensing circuit 320 in the first surge protection circuit 310. In particular, the first diode 321 prevents a leakage current to be conducted by the first current path I1, whereas the second diode 328 protects the gate-to-drain oxide of the second transistor 327 from facing a breakdown voltage.

When the voltage at the first pin 302 drops below the voltage at the second pin 304 by a substantial margin, a preset negative voltage is developed by the voltage clamp circuit 364 by way of conducting the reference current through the second current path I5. This reference current can be relatively small (e.g., several μA) when compared to the mirror current conducted by the third current path I6. Where the voltage clamp circuit 364 includes the Zener diode $D_{Z2}$ and the forward bias diode $D_{F2}$, the preset negative voltage is established by triggering a reverse bias in the Zener diode $D_{Z2}$ and a forward bias in the forward bias diode $D_{F2}$. The preset negative voltage is also received by the gate of the mirror transistor 367 in the third current path I6, which then pulls up the voltage at the sense output node 366 to generate the sense signal.

The sense signal is then amplified by the driver circuit 370 to generate a gate driver signal, which is delivered at the driver output node 376 for driving the gate terminal of the transistor 380. In a configuration where the transistor 380 has its drain terminal coupled to the second pin 304 and its source terminal coupled to the substrate node 306, the transistor 380 provides a low impedance path that is capable of conducting high surge current without develop a high clamp voltage. The surge current is further conducted by the body diode 341 once the substrate node 306 develops a potential that is greater than the first pin 302 by a forward bias voltage (e.g., 0.7V) of the body diode 341. Collectively, the transistor 380 and the body diode 341 form a low resistance path from the second pin 304 to the first pin 302.

Because the voltage sensing circuit 360 is coupled between the first and second pins 302 and 304, the voltage sensing circuit 360 is dissociated from the substrate node 306 in the surge current path. Advantageously, the voltage sensing circuit 360 is configured to detect the voltage difference between the first and second pins 302 and 304, instead of a partial voltage difference across the second pin 304 and the substrate node 306. This voltage detection scheme is capable of detecting any voltage drop (e.g., $V_F$) across the body diode 341, as well as the voltage drop across the parasitic routing between the first and second pins 302 and 304. That way, the surge protection device 301 may compensate these voltage drops to reduce the dynamic resistance to a near-zero value (e.g., 41 mΩ) during the negative surge event. Advantageously, this dynamic resistance is about 2.8 times less than the dynamic resistance provided by the device 100 in FIG. 1. When the potential difference across the first and second pins 302 and 304 is below the VRWM, the surge protection device 301 sustains a very small amount of leakage current. Yet the surge protection device 301 is capable of providing a robust response to a negative surge by precisely clamping the surge current under a safe operation range (e.g., 30A to 50A) for the downstream protected device 308.

Figure 4:
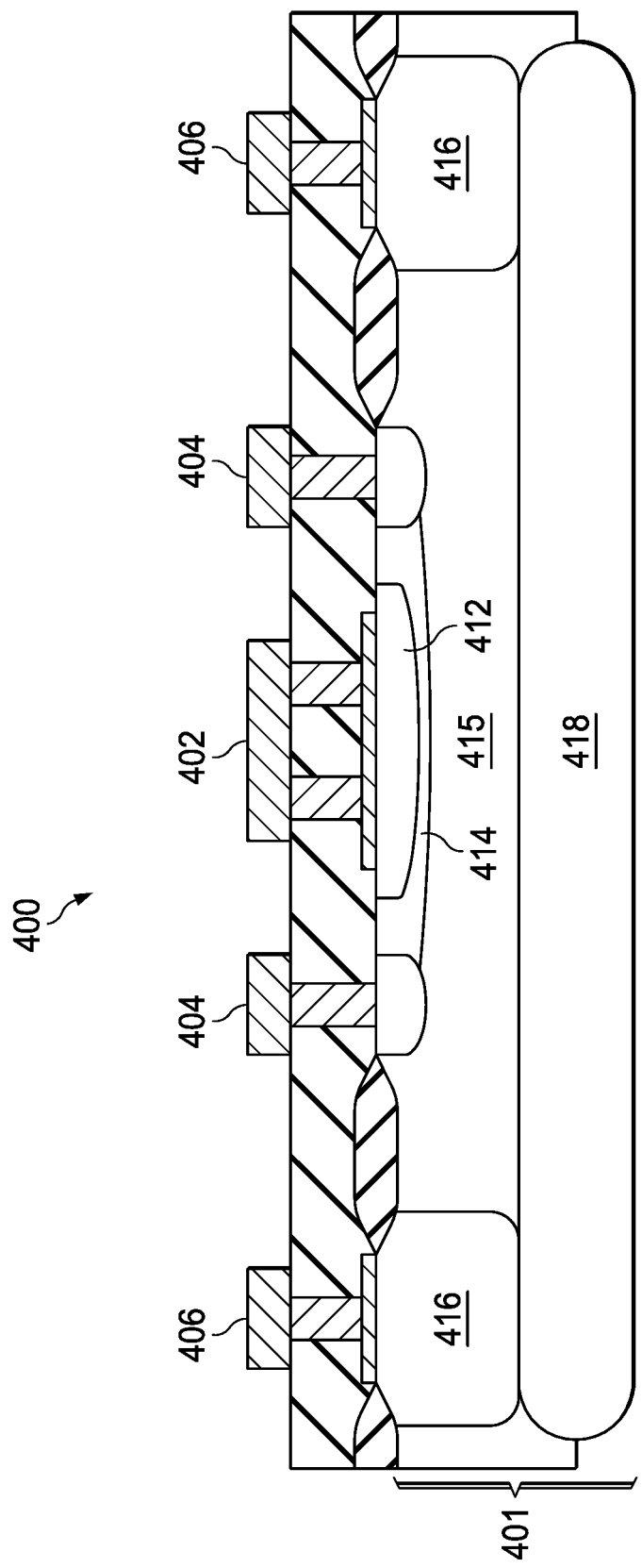
FIG. 4 shows a cross-sectional view of a diode structure according to an aspect of the present disclosure.

To further limit the parasitic effect in the Zener diodes $D_{Z1}$ and $D_{Z2}$, FIG. 4 shows an example diode structure 400 that cuts off the parasitic path when their respective voltage sensing circuit (e.g., 320 or 360) is activated and the potential of the substrate 401 is high. The diode structure 400 can be formed on a substrate 401 from which the substrate node 306 is extended. Within the substrate 401, the diode structure 400 includes a first doped region 412, a second doped region 415 under the first doped region 412, a third doped region 416 surrounding the second doped region 415, and a buried doped layer 418 under the second doped region 415. The first doped region 412 may include an n-type dopant. The second doped region 415 may include a p-type dopant. The third doped region 416 and the buried doped region 418 may include an n-type dopant as well. Together, these doped regions form a parasitic NPN structure. Above the substrate 401, the diode structure 400 includes a first terminal 402, a second terminal 404, and a third terminal 406. The first terminal 402 may serve as a cathode of the Zener diode and be realized as an emitter of the parasitic NPN structure. The second terminal 404 may serve as anode of the Zener diode and be realized as a base of the parasitic NPN structure. The third terminal 406 may serve as an isolation node and be realized as a collector terminal of the parasitic NPN structure. To suppress parasitic conduction, the third terminal 406 is coupled to the first terminal 402, such that the PN junction between the substrate 401 and the third doped region 416 is suppressed when their respective voltage sensing circuit (e.g., 320 or 360) is activated and the potential of the substrate 401 is high.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

Furthermore, terms of relativity, such as "about," "approximately," "substantially," "near," "within a proximity," "sufficient . . . to," "maximum," and "minimum," as applied to features of an integrated circuit and/or a semiconductor device can be understood with respect to the fabrication tolerances of a particular process for fabricating the integrated circuit and/or the semiconductor device. In addition, these terms of relativity can be understood within a framework for performing one or more functions by the integrated circuit and/or the semiconductor device.

More specifically, for example, the terms "substantially the same," "substantially equals," and "approximately the same" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A circuit comprising:
    a first transistor having a first drain, a first source, and a first gate;
    a second transistor having a second drain, a second source, and a second gate, the second source coupled to the first source;
    a first voltage sensing circuit coupled to the first drain and to the second drain;
    a first driver circuit coupled between the first voltage sensing circuit and the first gate, the first driver circuit comprising a third transistor having a third drain, a third source, and a third gate, the third drain coupled to the first drain, the third source coupled to the first gate, and the third gate coupled to the first voltage sensing circuit;
    a second voltage sensing circuit coupled to the first drain and to the second drain; and
    a second driver coupled between the second voltage sensing circuit and the second gate.

2. The circuit of claim 1, wherein the first voltage sensing circuit comprises:
    a first diode having a first anode and a first cathode, the first anode coupled to the first drain;
    a second diode having a second anode and a second cathode, the second cathode coupled to the second drain;
    a voltage clamp circuit coupled to the second cathode; and
    a current mirror coupled to the first cathode, to the second anode, and the voltage clamp circuit.

3. The circuit of claim 2, wherein the current mirror comprises:
    a fourth transistor having a fourth source, a fourth drain, and a fourth gate, the fourth source coupled to the first cathode, the fourth drain coupled to the voltage clamp circuit, and the fourth gate coupled to the fourth drain; and
    a fifth transistor having a fifth source, a fifth drain, and a fifth gate, the fifth source coupled to the first cathode, the fifth gate coupled to the fourth gate, and the fifth drain coupled to the second anode.

4. The circuit of claim 3, wherein the voltage clamp circuit comprises:
    a third diode having a third cathode and a third anode, the third anode coupled to the current mirror; and
    a fourth diode having a fourth cathode and a fourth anode, the fourth cathode coupled to the third cathode and the fourth anode coupled to the second drain.

5. The circuit of claim 1, further comprising a substrate coupled to the first source and to the second source.

6. The circuit of claim 1, wherein the first driver circuit further comprises:
    a resistor coupled between the third source and the first source.

7. The circuit of claim 1, wherein the circuit is an integrated circuit.

8. A circuit comprising:
a first diode having a first anode and a first cathode;
a second diode having a second anode and a second cathode;
a voltage clamp circuit coupled to the second cathode; and
a current mirror coupled to the first cathode, to the second anode, and to the voltage clamp circuit, wherein the current mirror comprises:
  a fourth transistor having a fourth source, a fourth drain, and a fourth gate, the fourth source coupled to the first cathode, the fourth drain coupled to the voltage clamp circuit, and the fourth gate coupled to the fourth drain; and
  a fifth transistor having a fifth source, a fifth drain, and a fifth gate, the fifth source coupled to the first cathode, the fifth gate coupled to the fourth gate, and the fifth drain coupled to the second anode.

9. The circuit of claim 8, wherein the voltage clamp circuit comprises:
a third diode having a third cathode and a third anode, the third anode coupled to the current mirror; and
a fourth diode having a fourth cathode and a fourth anode, the fourth cathode coupled to the third cathode and the fourth anode coupled to the second cathode.

10. The circuit of claim 9, further comprising a resistor coupled between the current mirror and the third anode.

11. The circuit of claim 8, further comprising a resistor coupled between the voltage clamp circuit and the second cathode.

12. A circuit comprising:
a first transistor having a first drain, a first source, and a first gate;
a second transistor having a second drain, a second source, and a second gate, the second source coupled to the first source;
a positive sensing circuit directly connected to the first drain and to the second drain; and
a negative sensing circuit directly connected to the first drain and to the second drain.

13. The circuit of claim 12, further comprising:
a first pin coupled to the first drain, wherein the first pin is adapted to be coupled to a device; and
a second pin coupled to the second drain, wherein the second pin is adapted to be coupled to the device.

14. The circuit of claim 13, wherein the positive sensing circuit is configured to cause the first transistor to conduct current responsive to determining that a voltage between the first drain and the second drain is greater than a positive threshold.

15. The circuit of claim 14, wherein the negative sensing circuit is configured to cause the second transistor to conduct current responsive to determining that a voltage between the first drain and the second drain is less than a negative threshold.

16. The circuit of claim 12, wherein the positive sensing circuit comprises:
a first diode having a first anode and a first cathode, the first anode coupled to the first drain;
a second diode having a second anode and a second cathode, the second cathode coupled to the second drain;
a voltage clamp circuit coupled to the second cathode; and
a current mirror coupled to the first cathode, to the second anode, and the voltage clamp circuit.

17. The circuit of claim 16, wherein the current mirror comprises:
a fourth transistor having a fourth source, a fourth drain, and a fourth gate, the fourth source coupled to the first cathode, the fourth drain coupled to the voltage clamp circuit, and the fourth gate coupled to the fourth drain; and
a fifth transistor having a fifth source, a fifth drain, and a fifth gate, the fifth source coupled to the first cathode, the fifth gate coupled to the fourth gate, and the fifth drain coupled to the second anode.

18. The circuit of claim 16, wherein the voltage clamp circuit comprises:
a third diode having a third cathode and a third anode, the third anode coupled to the current mirror; and
a fourth diode having a fourth cathode and a fourth anode, the fourth cathode coupled to the third cathode and the fourth anode coupled to the second drain.

19. The circuit of claim 12, further comprising a substrate coupled to the first source and to the second source.

* * * * *